(12) United States Patent
Matsuda et al.

(10) Patent No.: US 8,552,604 B2
(45) Date of Patent: Oct. 8, 2013

(54) DRIVE UNIT OF ELECTRIC MOTOR AND MOTORIZED EQUIPMENT USING THE DRIVE UNIT

(75) Inventors: Naoki Matsuda, Handa (JP); Masashi Yamasaki, Obu (JP)

(73) Assignee: Denso Corporation, Kariya (JP)

( * ) Notice: Subject to any disclaimer, the term of this patent is extended or adjusted under 35 U.S.C. 154(b) by 236 days.

(21) Appl. No.: 13/087,670

(22) Filed: Apr. 15, 2011

(65) Prior Publication Data

US 2011/0254387 A1 Oct. 20, 2011

(30) Foreign Application Priority Data

Apr. 16, 2010 (JP) .................................. 2010-94789

(51) Int. Cl.
  *H02K 11/00* (2006.01)
  *H02K 5/22* (2006.01)
  *H02K 5/08* (2006.01)
  *H02K 15/12* (2006.01)

(52) U.S. Cl.
  CPC .................. *H02K 5/225* (2013.01); *H02K 5/08* (2013.01); *H02K 15/12* (2013.01)
  USPC ............ 310/68 R; 310/43; 310/67 R; 310/71; 318/400.01

(58) Field of Classification Search
  CPC .......... H02K 5/08; H02K 15/12; H02K 5/225
  USPC ..................... 310/43, 67 R, 68 R, 68 A–68 D
  See application file for complete search history.

(56) References Cited

U.S. PATENT DOCUMENTS

| | | | |
|---|---|---|---|
| 4,668,898 A * | 5/1987 | Harms et al. ............. | 318/400.21 |
| 5,602,451 A | 2/1997 | Kohge et al. | |
| 5,783,881 A * | 7/1998 | Best et al. ................... | 310/68 C |
| 6,078,155 A * | 6/2000 | Tominaga et al. ............ | 318/293 |
| 6,144,571 A | 11/2000 | Sasaki et al. | |
| 7,692,525 B1 * | 4/2010 | Halpin et al. ................... | 336/96 |
| 2003/0127921 A1 | 7/2003 | Akutsu et al. | |
| 2006/0086981 A1 * | 4/2006 | Yamaguchi et al. .......... | 257/347 |
| 2006/0232942 A1 * | 10/2006 | Nakatsu et al. ............... | 361/710 |

(Continued)

FOREIGN PATENT DOCUMENTS

| | | |
|---|---|---|
| JP | 10-201168 | 7/1998 |
| JP | 10-234158 | 9/1998 |

(Continued)

OTHER PUBLICATIONS

Yamasaki, U.S. Appl. No. 13/087,683, filed Apr. 15, 2011.

(Continued)

Primary Examiner — John K Kim
(74) Attorney, Agent, or Firm — Nixon & Vanderhye PC

(57) ABSTRACT

A power module of a drive unit of an electric motor is formed by inserting multiple power transistors, which supply a drive current to a coil wound around a stator or a rotor, and wirings connecting the power transistors in a resin, which is formed in the shape of a plate, by resin molding. Electronic components such as aluminum electrolytic capacitors, a choke coil and a first connector are provided in a board thickness direction of the power module and are electrically connected with the wirings of the power module. Thus, a construction for electrically connecting the wirings of the power module formed by the resin molding and the electronic components can be simplified.

9 Claims, 17 Drawing Sheets

(56) References Cited

U.S. PATENT DOCUMENTS

| | | | |
|---|---|---|---|
| 2008/0116838 A1* | 5/2008 | Hattori et al. | 318/722 |
| 2008/0211331 A1* | 9/2008 | Dubuc et al. | 310/71 |
| 2009/0231811 A1* | 9/2009 | Tokuyama et al. | 361/699 |
| 2010/0289388 A1* | 11/2010 | Kimmich et al. | 310/68 D |
| 2010/0301690 A1* | 12/2010 | De Filippis | 310/64 |
| 2010/0327677 A1* | 12/2010 | Iwai et al. | 310/64 |
| 2010/0327678 A1* | 12/2010 | Yamasaki et al. | 310/64 |
| 2011/0254387 A1* | 10/2011 | Matsuda et al. | 310/43 |

FOREIGN PATENT DOCUMENTS

| | | |
|---|---|---|
| JP | 11-225459 | 8/1999 |
| JP | 11-356006 | 12/1999 |
| JP | 2002-345211 | 11/2002 |
| JP | 2004-254359 | 9/2004 |
| JP | 2005-304203 | 10/2005 |
| JP | P2007-060739 A | 3/2007 |
| JP | P2009-248864 A | 10/2009 |

OTHER PUBLICATIONS

Minato, U.S. Appl. No. 13/087,658, filed Apr. 15, 2011.

Office Action (2 pages) dated Jan. 11, 2013 issued in corresponding Japanese Application No. 2010-094789 and English translation (2 pages).

Japanese Office Action dated May 8, 2012, issued in corresponding Japanese Application No. 2010-094789, with English translation.

Office Action (11 pages) dated May 30, 2013 issued in corresponding Chinese Application No. 201110097749.9 and English translation (11 pages).

* cited by examiner

DRIVE UNIT OF ELECTRIC MOTOR AND MOTORIZED EQUIPMENT USING THE DRIVE UNIT

CROSS REFERENCE TO RELATED APPLICATION

This application is based on and incorporates herein by reference Japanese Patent Application No. 2010-94789 filed on Apr. 16, 2010.

BACKGROUND OF THE INVENTION

1. Field of the Invention

The present invention relates to a drive unit of an electric motor and a motorized equipment using the drive unit.

2. Description of Related Art

Conventionally, there has been publicly known a motorized equipment used for electric power steering for assisting steering, which is performed by a driver, the motorized equipment integrating an electric motor and a drive unit for driving the electric motor.

In a drive unit described in each of Patent document 1 (JP-A-2003-204654) and 2 (JP-A-2002-345211), large-size electronic components such as power transistors and capacitors are mounted to a metallic substrate attached to a heat sink.

In a drive unit described in Patent document 3 (JP-A-2005-304203), power transistors and capacitors are mounted to a metallic substrate attached to a heat sink. A control board mounted with a microcomputer and the like is provided to be separated from the metallic substrate by a predetermined distance. A large-current wiring busbar (large current substrate 62) mounted with relays, a choke coil and the like is provided between the metallic substrate and the control board.

In a drive unit described in Patent document 4 (JP-A-2004-254359), power transistors are mounted to a metallic substrate attached to a heat sink. A control board is provided to be separated from the metallic board by a predetermined distance. A large current wiring busbar (large current substrate 28) mounted with relays, capacitors and the like is provided between the metallic substrate and the control board.

In the drive unit of each of Patent documents 1 and 2, the power transistors and the capacitors are mounted to the metallic substrate. Accordingly, an area of the metallic substrate is increased as the number of the power transistors increases. Therefore, there is a concern that a body size of the drive unit enlarges.

In the drive unit described in each of Patent documents 3 and 4, the three layers of substrates are formed by the metallic substrate, the large current wiring busbar and the control board. Therefore, there is a concern that a body size of the drive unit enlarges. Moreover, terminals for electrically connecting the metallic substrate and the large current wiring busbar and terminals for electrically connecting the large current wiring busbar and the control board are necessary. Therefore, the number of parts increases and a manufacturing cost increases. Furthermore, spaces for connecting the terminals to the respective substrates by a soldering process and the like are necessary. Therefore, there is a concern that the body size of the drive unit enlarges.

SUMMARY OF THE INVENTION

It is an object of the present invention to provide a drive unit reducing its body size and to provide a motorized equipment using the drive unit. It is another object of the present invention to provide a drive unit reducing its manufacturing cost and to provide a motorized equipment using the drive unit.

According to a first example aspect of the present invention, a drive unit of an electric motor, which has a rotor rotatable relative to a stator, rotates and drives the rotor relative to the stator. The drive unit has a power module formed by inserting multiple power transistors, which supply a drive current to a coil wound around the stator or the rotor, and wirings connecting the power transistors in a resin, which is formed in the shape of a plate, by resin molding. The drive unit has an electronic component that is provided in a board thickness direction of the power module and electrically connected with the wirings of the power module.

With such the construction, the wirings inserted in the power module by the resin molding are directly connected with the electronic component. Accordingly, a conventional metallic substrate mounted with power transistors, a conventional large current wiring busbar mounted with an electronic component and terminals connecting the metallic substrate and the large current wiring busbar can be abolished. Thus, the number of parts can be reduced, so a body size of the drive unit can be reduced and a manufacturing cost of the drive unit can be reduced. Furthermore, a construction for electrically connecting the wirings of the power module and the electronic components can be simplified. Therefore, spaces for the connection can be reduced and the body size of the drive unit can be reduced.

According to a second example aspect of the present invention, the power transistors and the wirings connecting the power transistors are arranged on a plane. Thus, the board thickness of the power module can be reduced, and the body size of the drive unit can be reduced. Moreover, the wirings can be formed from a copper plate by press working, for example. Therefore, a processing cost can be reduced.

According to a third example aspect of the present invention, the electronic component has lead wires extending from a main body thereof. The lead wires pass through the power module in the board thickness direction of the power module and are electrically connected with the wirings of the power module inside holes formed on a side of the power module opposite to the main body of the electronic component. Thus, the connections between the lead wires of the electronic component and the wirings of the power module do not protrude outward from an outer wall of the power module in the thickness direction of the power module. Thus, the body size of the drive unit can be reduced.

According to a fourth example aspect of the present invention, the power module has a terminal, one end of which is connected with the power transistor and the other end of which protrudes from the resin of the power module to an outside and is electrically connectable with an extraction line of the coil. The power transistors are arranged in outer edge portions of the power module. Thus, the terminal for electrically connecting the power transistor and the coil can be shortened, and an electric resistance of the terminal can be reduced. Therefore, a loss in the drive current, which is supplied from the power transistor to the coil, can be reduced.

According to a fifth example aspect of the present invention, the wirings of the power module include a first wiring on one of a power supply side and a ground side, the first wiring extending in a central portion of the power module along an arrangement direction of the power transistors, and a second wiring on the other one of the power supply side and the ground side, the second wiring extending on both sides of the first wiring along the arrangement direction of the power transistors and being electrically connected with the power transistors. The power module has jumper wirings for electrically connecting the first wiring and the power transistors. Thus, the wirings of the power module can be shortened and electric resistances of the wirings can be reduced. Therefore, the loss in the current flowing through the power module can be reduced.

Moreover, since the power supply side wiring and the ground side wiring are arranged parallel to each other, the lead wires of the electronic component arranged in the board thickness direction of the power module and the wirings of the power module can be electrically connected with ease.

According to a sixth example aspect of the present invention, the electronic component is a capacitor for absorbing a ripple current generated by switching of the power transistor.

According to a seventh example aspect of the present invention, the electronic component is a choke coil for attenuating a high-frequency current flowing through the power transistor.

According to an eighth example aspect of the present invention, the drive unit further has a connector that is provided in the board thickness direction of the power module and electrically connected with the wirings of the power module.

In this way, by providing the large-size electronic component or the connector on one side of the power module with respect to the board thickness direction of the power module, the body size of the drive unit can be reduced.

According to a ninth example aspect of the present invention, a motorized equipment has a stator and a rotor, which is provided to be rotatable relative to the stator. The motorized equipment has a power module formed by inserting multiple power transistors, which supply a drive current to a coil wound around the stator or the rotor, and wirings connecting the power transistors in a resin, which is formed in the shape of a plate, by resin molding. The motorized equipment has an electronic component that is provided in a board thickness direction of the power module and electrically connected with the wirings of the power module. Thus, effects similar to those of the first example aspect of the present invention can be exerted. Accordingly, a body size of the motorized equipment can be reduced, and a manufacturing cost of the motorized equipment can be reduced. The second to eighth example aspects of the present invention can be applied to the ninth example aspect of the present invention.

According to a tenth example aspect of the present invention, the motorized equipment further has a control board provided in the board thickness direction of the power module and substantially parallel to the power module. The control board has a control circuit for controlling relative rotation drive between the stator and the rotor. The power module has a signal wiring, one end of which is connected with the power transistor and the other end of which protrudes from an outer edge portion of the power module to an outside and is electrically connected with the control circuit of the control board. Thus, the control circuit of the control board and the signal wiring can be connected at an outer edge portion of the control board. Therefore, a surface inside the outer edge portion of the control board can be used effectively to arrange components constituting the control circuit such as a microcomputer, a custom IC and a position sensor. Accordingly, a degree of freedom of design of the control circuit is heightened, so the mounting area of the control circuit on the control board can be reduced. As a result, the body size of the motorized equipment can be reduced.

According to an eleventh example aspect of the present invention, the motorized equipment further has a heat sink provided on a side of the power module opposite to the control board for absorbing a heat generated by the power transistors.

The power transistors are arranged in outer edge portions on both sides of the power module formed substantially in the rectangular shape. The electronic component is arranged inside the outer edge portions of the power module. The heat sink has a plurality of columnar sections, which are thermally connected with radiation sections of the power transistors exposed from an outer wall of the power module in the board thickness direction of the power module, and a recess formed between the columnar sections for accommodating the electronic component. By arranging the radiation sections of the power transistors on the same plane, the heat sink can efficiently absorb the heat generated by the power module. By accommodating the electronic component in the recess of the heat sink, the body size of the motorized equipment can be reduced.

BRIEF DESCRIPTION OF THE DRAWINGS

Features and advantages of embodiments will be appreciated, as well as methods of operation and the function of the related parts, from a study of the following detailed description, the appended claims, and the drawings, all of which form a part of this application. In the drawings:

DETAILED DESCRIPTION OF EXAMPLE EMBODIMENT

Hereafter, embodiments of the present invention will be described with reference to the drawings.

First Embodiment

Figure 6:
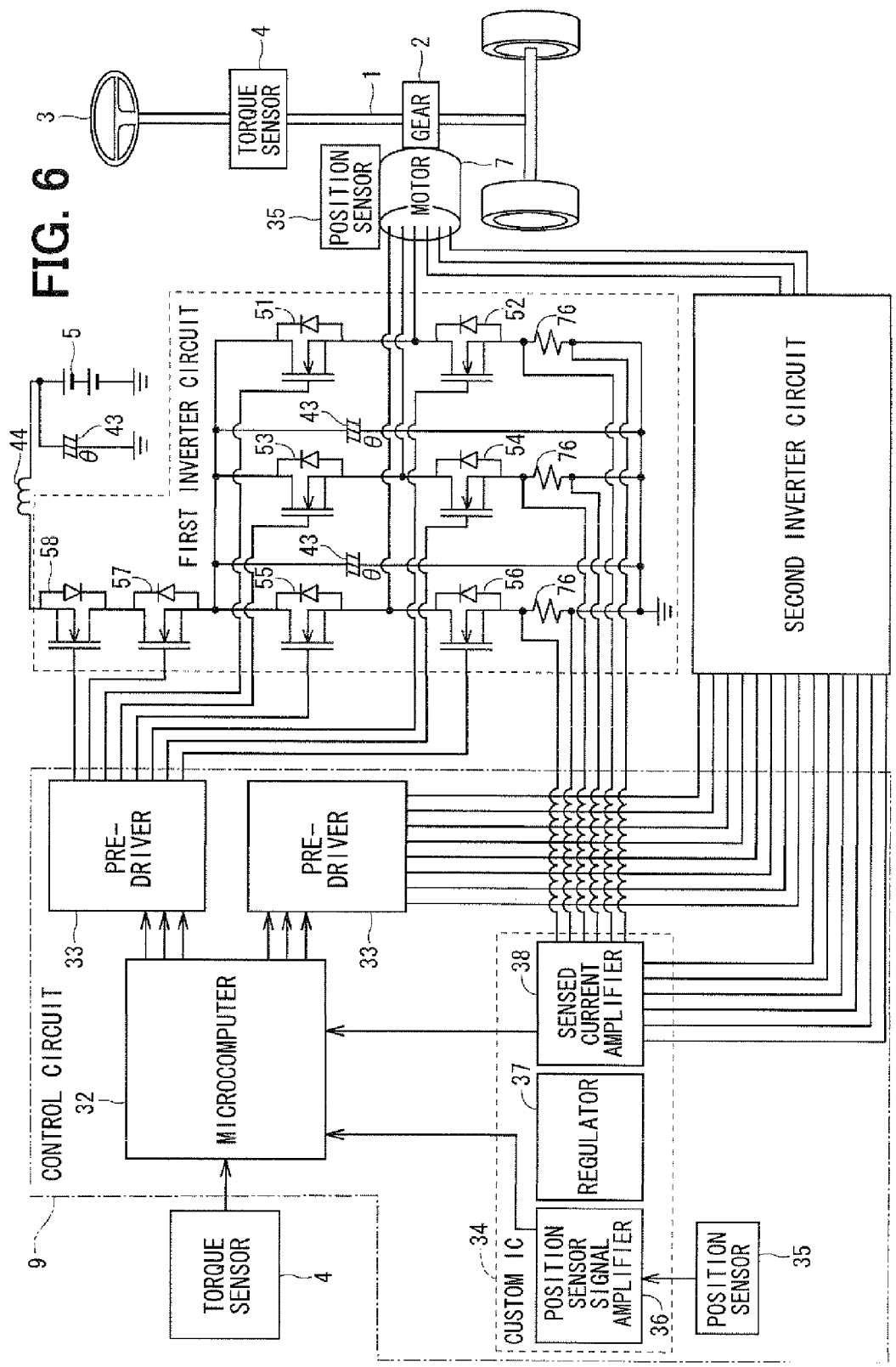
FIG. 6 is a circuit diagram showing the motorized equipment according to the first embodiment.

FIGS. 1 to 19 are diagrams each showing a motorized equipment according to a first embodiment of the present invention. The motorized equipment 10 according to the present embodiment is a brushless motor used for electric power steering. As shown in FIG. 6, the motorized equipment 10 meshes with a gear 2 of a column shaft 1. The motorized equipment 10 performs normal rotation and reverse rotation based on a vehicle speed signal, which is transmitted from CAN and the like, and a torque signal outputted from a torque sensor 4, which senses steering torque of a steering 3. Thus, the motorized equipment 10 generates a force for assisting steering.

Figure 1:
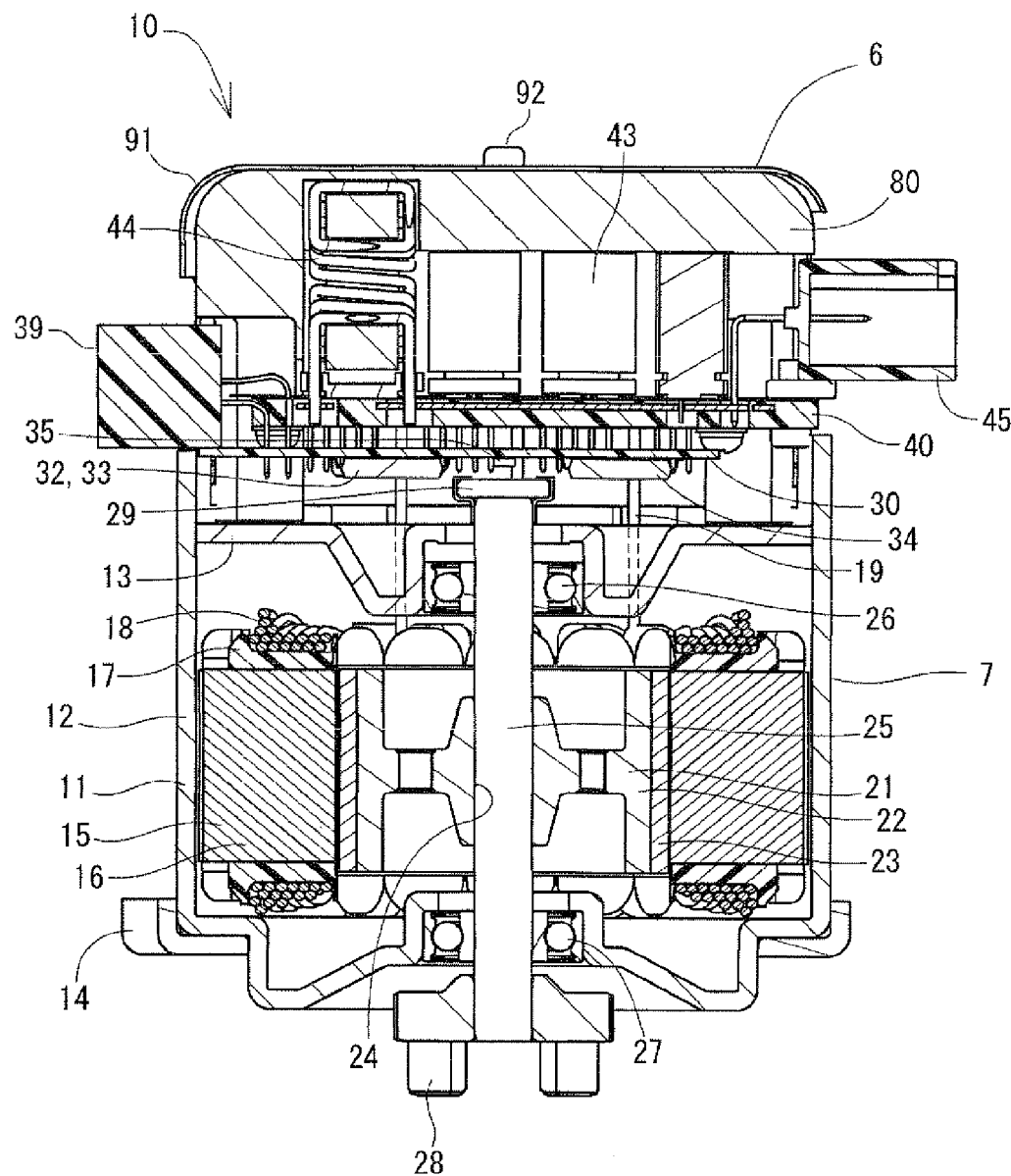
FIG. 1 is a cross-sectional view showing a motorized equipment according to a first embodiment of the present invention.
Figure 2:
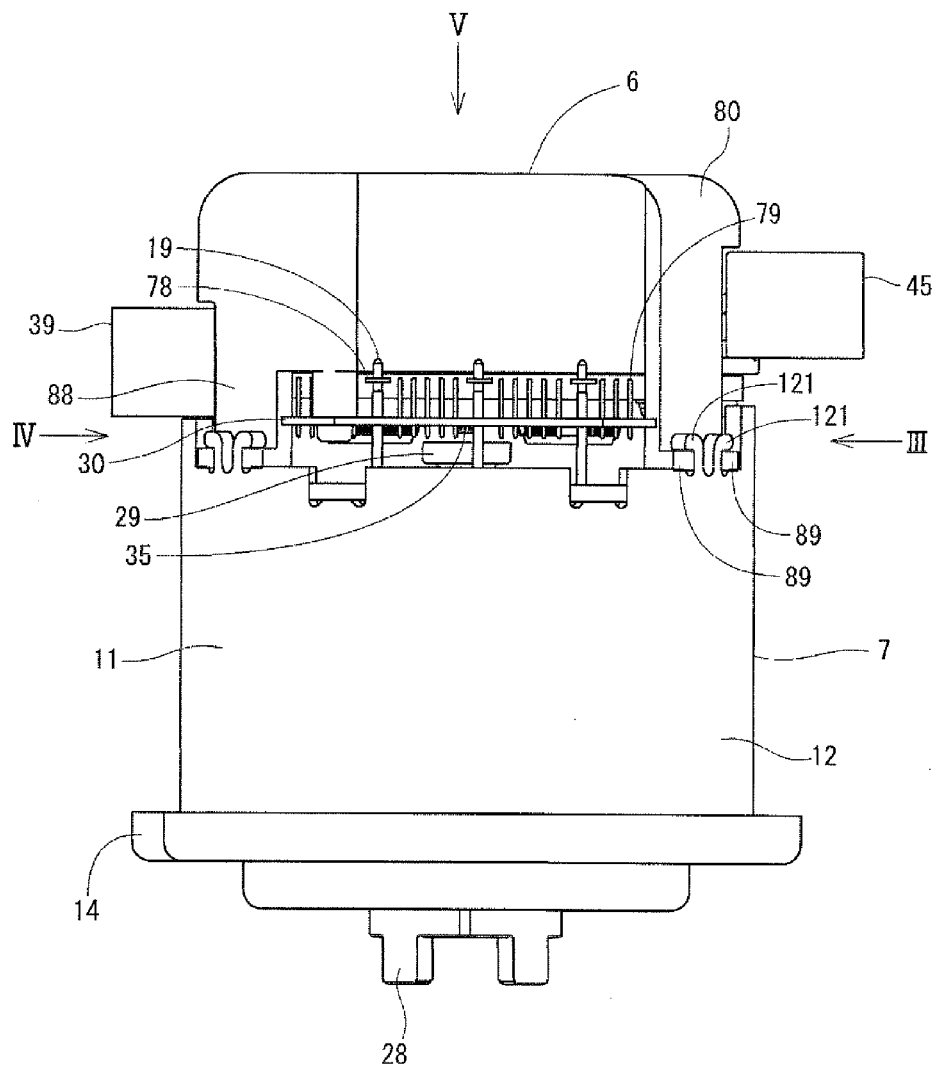
FIG. 2 is a side view showing the motorized equipment according to the first embodiment.
Figure 3:
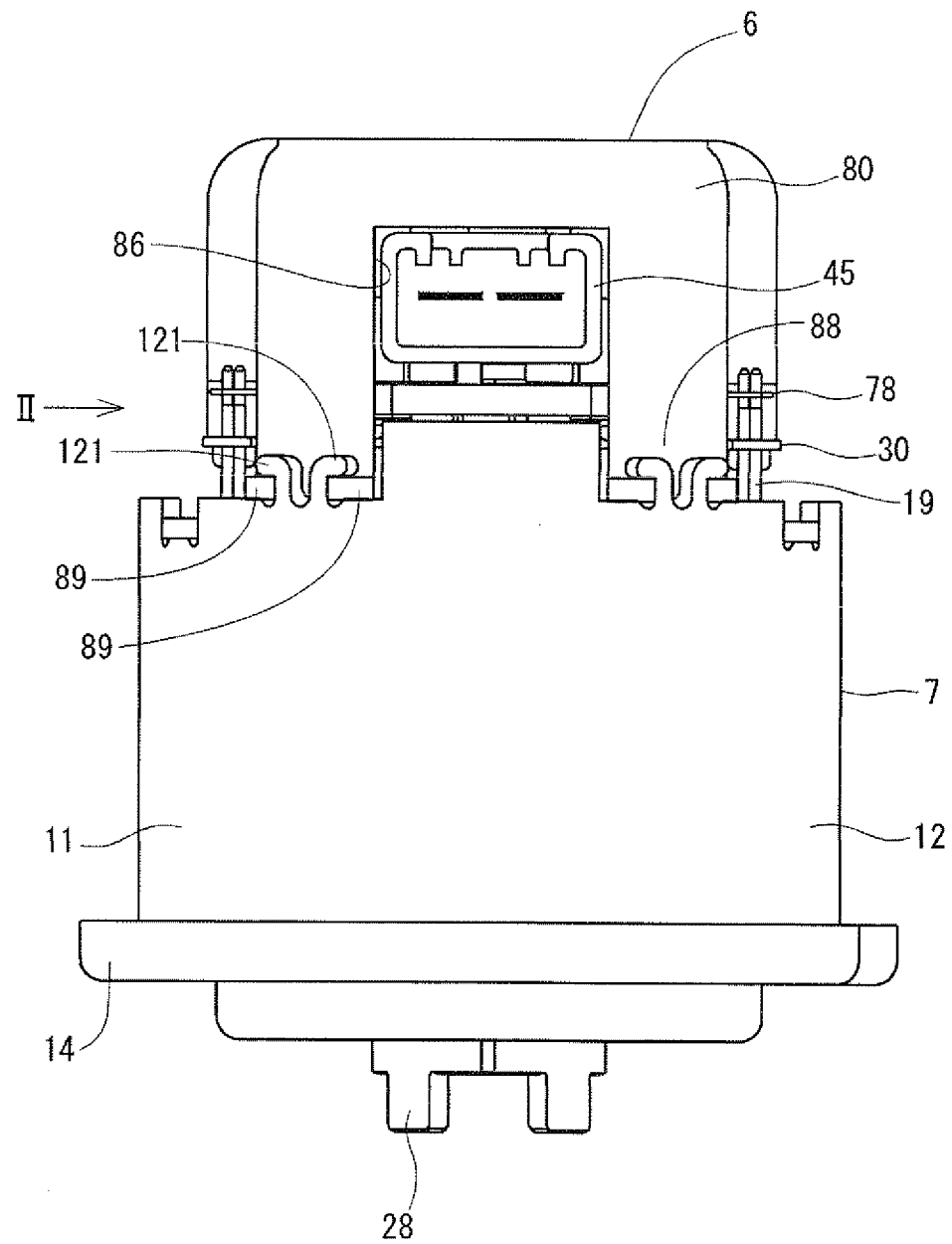
FIG. 3 is a view showing the motorized equipment of FIG. 2 along a direction of an arrow mark III.
Figure 4:
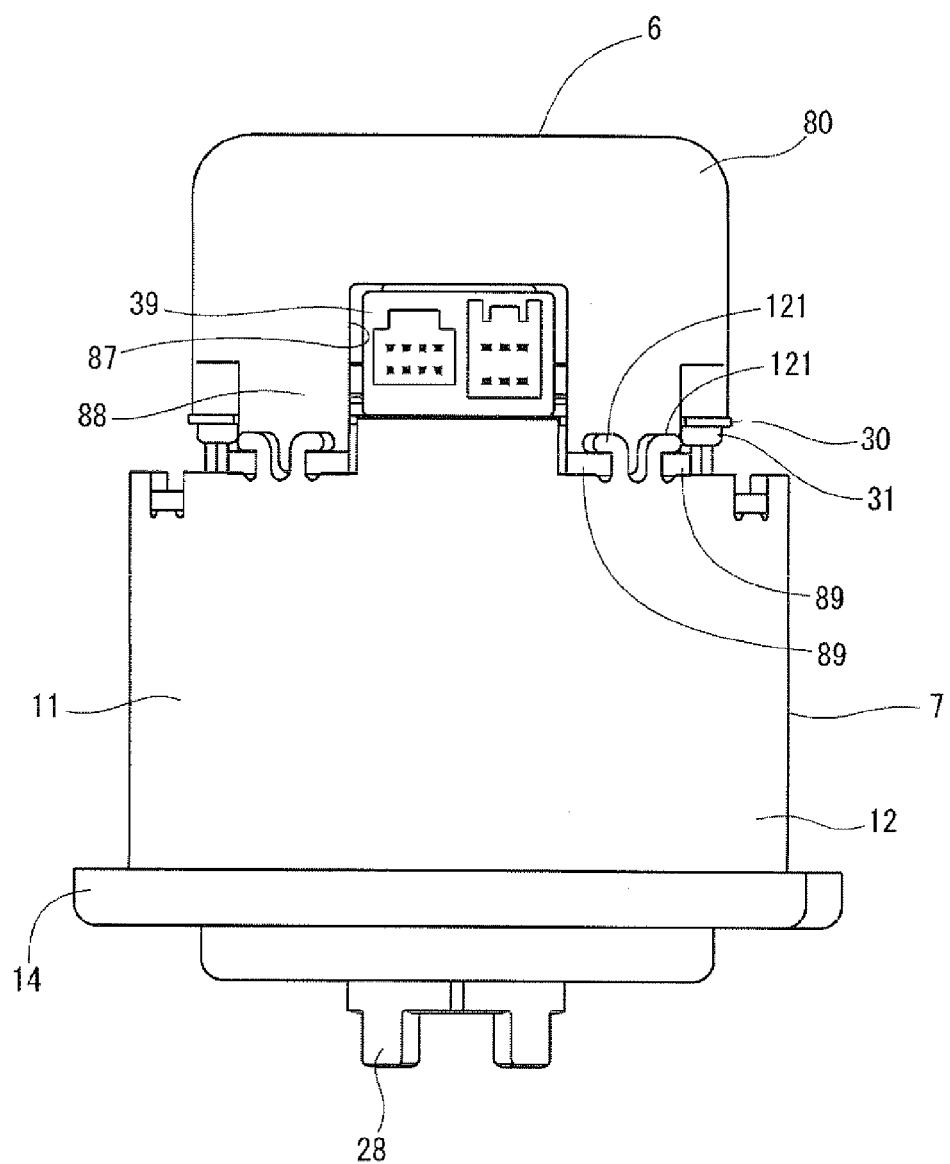
FIG. 4 is a view showing the motorized equipment of FIG. 2 along a direction of an arrow mark IV.
Figure 5:
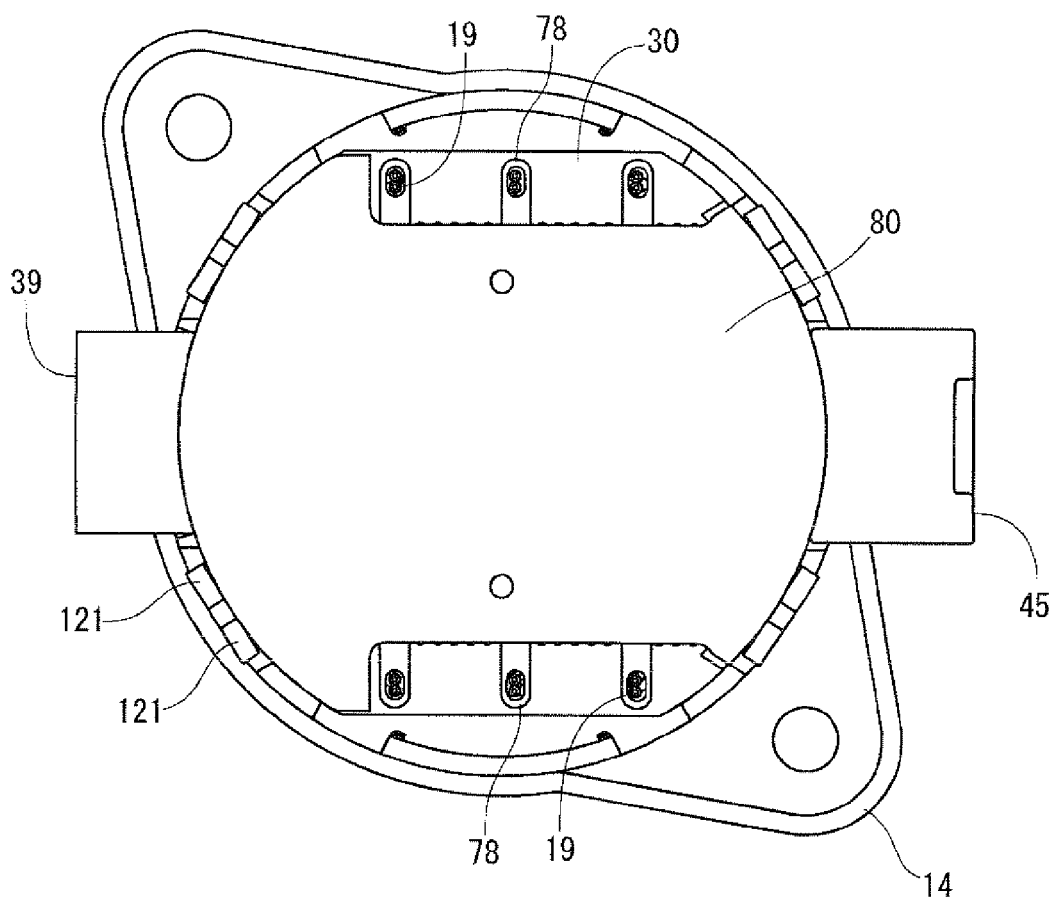
FIG. 5 is a view showing the motorized equipment of FIG. 2 along a direction of an arrow mark V.
Figure 7:
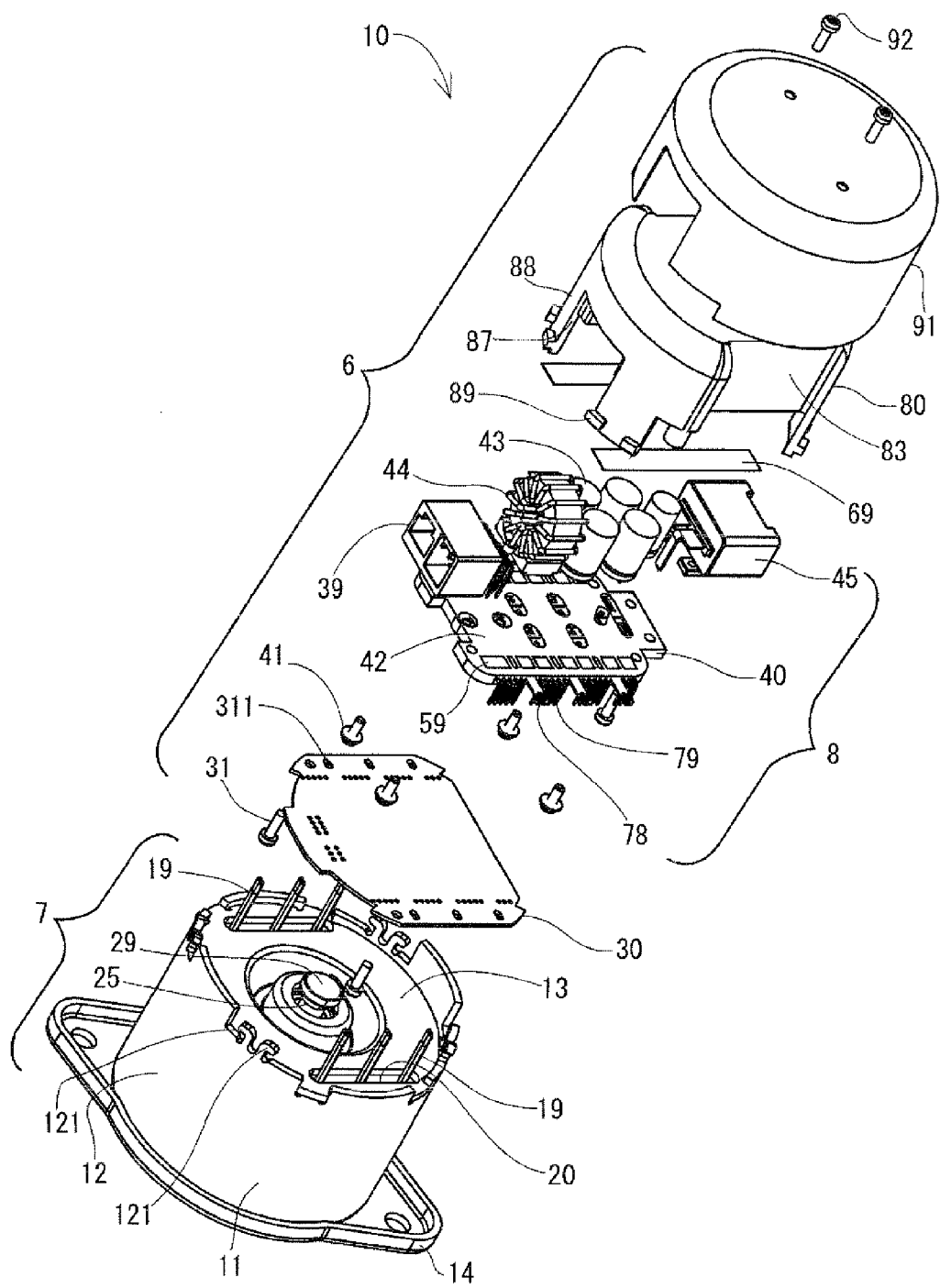
FIG. 7 is an exploded perspective view showing the motorized equipment according to the first embodiment.
Figure 8:
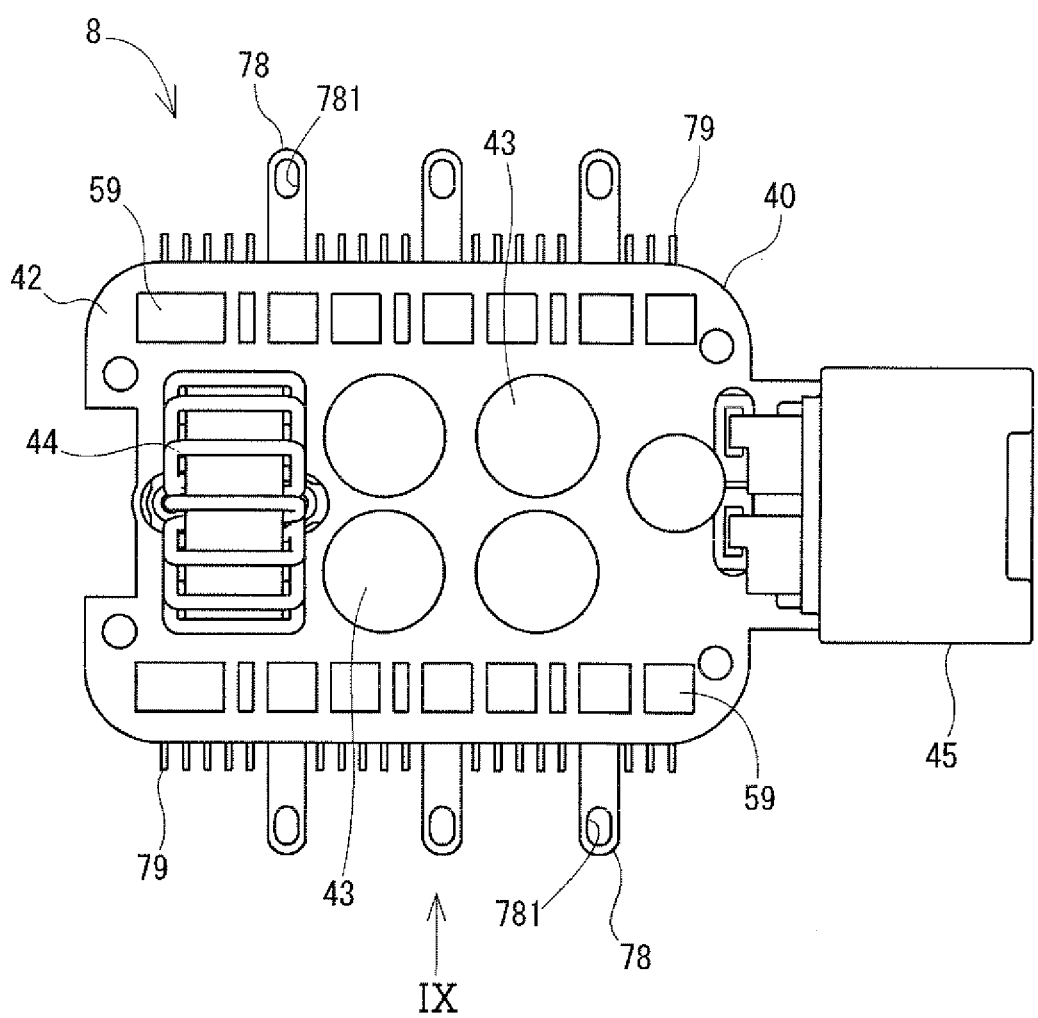
FIG. 8 is a plan view showing a drive unit of the motorized equipment according to the first embodiment.
Figure 9:
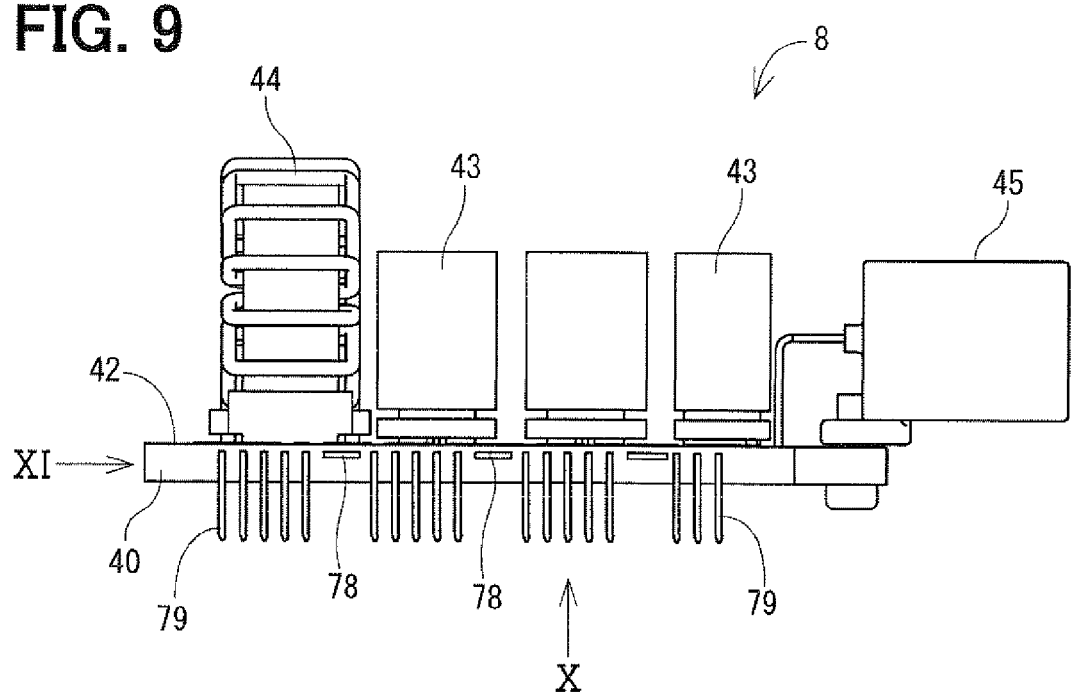
FIG. 9 is a view showing the drive unit of FIG. 8 along a direction of an arrow mark IX.
Figure 10:
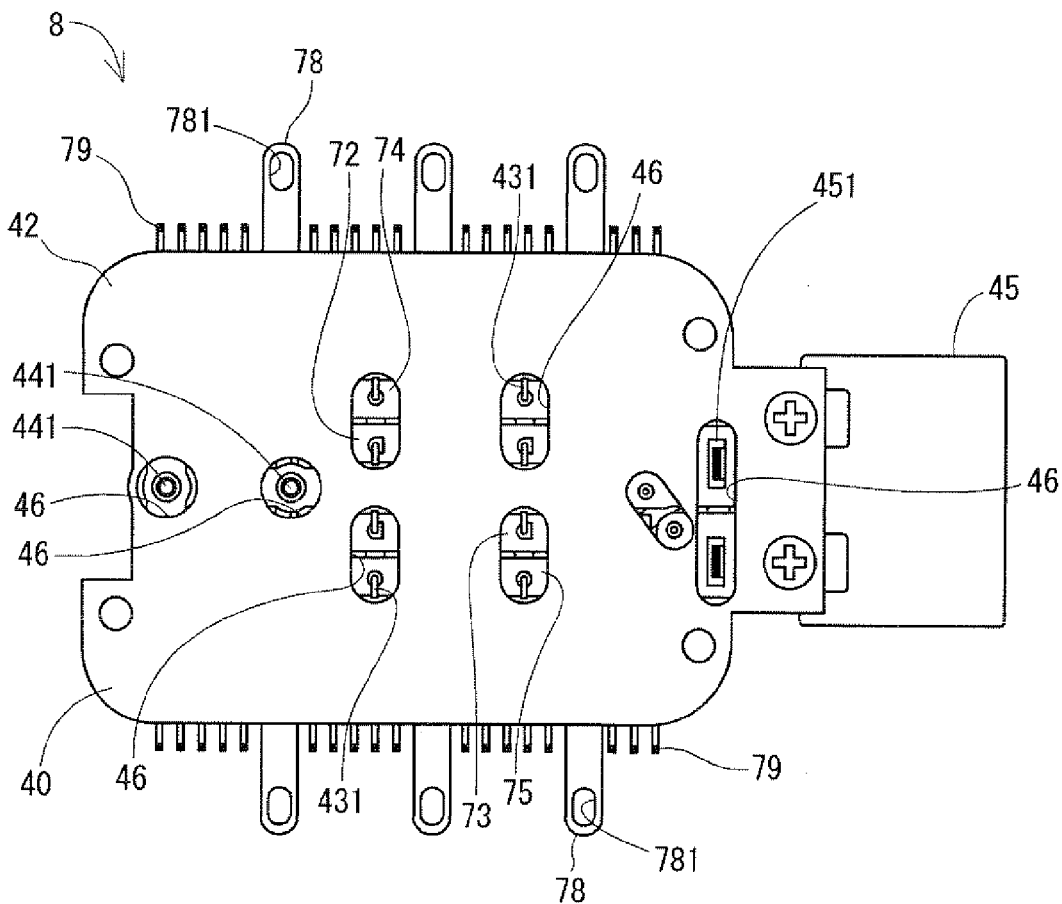
FIG. 10 is a view showing the drive unit of FIG. 9 along a direction of an arrow mark X.
Figure 11:
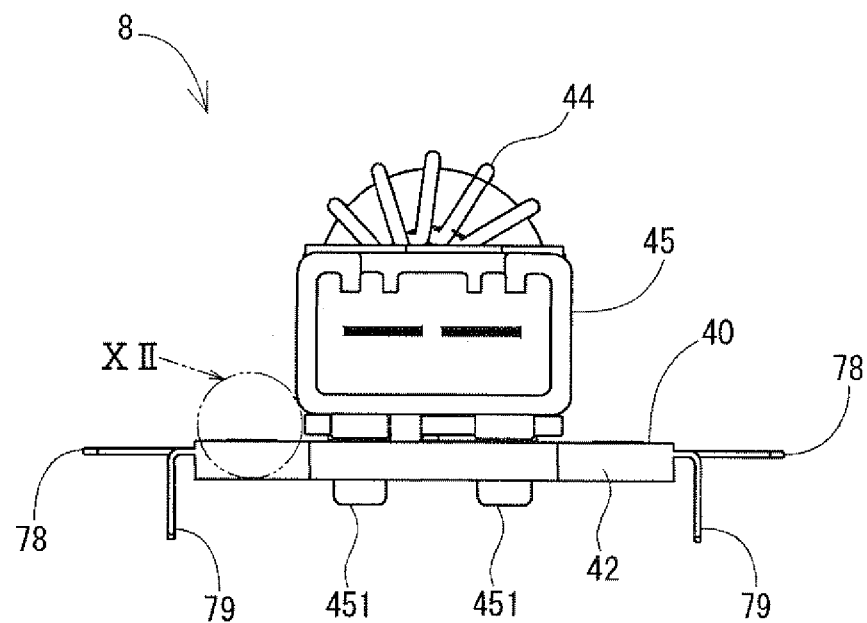
FIG. 11 is a view showing the drive unit of FIG. 9 along a direction of an arrow mark XI.

FIG. 1 is a cross-sectional view showing the motorized equipment 10 according to the present embodiment. FIGS. 2 to 5 are views each showing outer appearance of the motorized equipment 10 according to the present embodiment. FIG. 7 is an exploded perspective view showing the motorized equipment 10 according to the present embodiment.

The motorized equipment 10 has an electric motor 7 and a controller 6. The electric motor 7 is composed of a motor case 11, a stator 15, a rotor 21, a shaft 25 and the like. The controller 6 is composed of a control board 30, a power module 40, a heat sink 80 and the like. A drive unit 8 according to the present invention is composed of the power module 40, aluminum electrolytic capacitors 43, a choke coil 44, a first connector 45 and the like as shown in FIGS. 8 to 13.

First, the electric motor 7 will be explained. The motor case 11 is made of iron or the like, for example. The motor case 11 consists of a first motor case 12 in the shape of a cylinder with bottom and a second motor case 13 blocking an opening of the first motor case 12 on a controller 6 side. A frame end 14 made of aluminum is fixed to an outer wall of the bottom portion of the first motor case 12.

The stator 15 is fixed to a radially inside wall of the first motor case 12. The stator 15 has salient poles 16 and slots (not shown) arranged alternately in a circumferential direction. A coil 18 is accommodated in the slots of the stator 15 across an insulator 17. The coil 18 is wound around the salient poles 16. The coil 18 provides two systems of three-phase wingding. Extraction lines 19 extending from the coil 18 extend through holes 20 formed in the second motor case 13 in a board thickness direction of the second motor case 13 and extend to the controller 6 side.

The rotor 21 is rotatably provided radially inside the stator 15. The rotor 21 has permanent magnets 23 provided radially outside a rotor core 22. The permanent magnets 23 are magnetized such that magnetic poles of the permanent magnets 23 alternate along a circumferential direction. The shaft 25 is fixed to a shaft hole 24 formed in a rotational center of the rotor 21. One axial end of the shaft 25 is fitted to a bearing 26 provided in the second motor case 13, and the other axial end of the shaft 25 is fitted to a bearing 27 provided in the bottom portion of the first motor case 12. Thus, the shaft 25 is rotatably supported by the first and second motor cases 12, 13.

With such the construction, if a drive current is supplied to the coil 18, a rotational magnetic field is formed. Thus, the rotor 21 and the shaft 25 perform normal rotation or reverse rotation with respect to the stator 15 and the motor case 11. A drive force is outputted from an output end 28 of the shaft 25 on a frame end 14 side to the gear 2 of the column shaft 1.

Next, the controller 6 will be explained. As shown in FIG. 7, the controller 6 is constructed of the control board 30, the power module 40, the heat sink 80 and a cover 91, which are arranged in this order on one axial end side of the shaft 25 of the motor. The choke coil 44 and the aluminum electrolytic capacitors 43 are provided in a board thickness direction of the power module 40 and are electrically connected with wirings of the power module 40. The control board 30 and the power module 40 are fixed to the heat sink 80 with screws 31, 41 respectively. Radiator plates 59 of power transistors are exposed from a mold resin 42 of the power module 40 in the board thickness direction of the power module 40. The radiator plates 59 are closely fixed to the heat sink 80 across insulation radiation sheets 69.

Next, the drive unit 8 will be explained with reference to FIGS. 8 to 13. In FIG. 13, the mold resin 42 of the power module 40 is shown by broken lines. The power module 40 is formed by molding a resin into the shape of a substantially rectangular plate, in which twelve power transistors 51-56, 61-66 constituting two sets of inverter circuits, four power transistors 57, 58, 67, 68 for circuit protection, wirings 70-75 for connecting the power transistors 51-58, 61-68, shunt resistances 76, jumper wirings 77 and the like are inserted.

The power transistors 51-58, 61-68 and the wirings 70-75 are arranged on the same plane. The wirings 70-75 can be formed from a sheet of copper plate by press working or the like, for example.

The power transistors 51-58, 61-68 form two sets of inverter circuits. The eight power transistors 51-58 constituting one set of the inverter circuit are arranged in line in an outer edge portion on one long side. The eight power transistors 61-68 constituting the other set of the inverter circuit are arranged in line in an outer edge portion on the other long side. The positions where the power transistors 51-58, 61-68 are arranged correspond to the outer edge portions of the power module 40.

Figure 12:
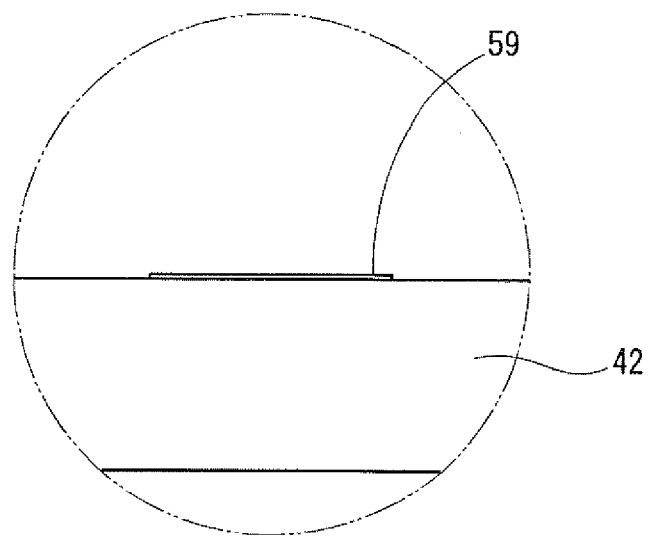
FIG. 12 is an enlarged partial view showing a part of the drive unit of FIG. 11 indicated by a circle XII.
Figure 13:
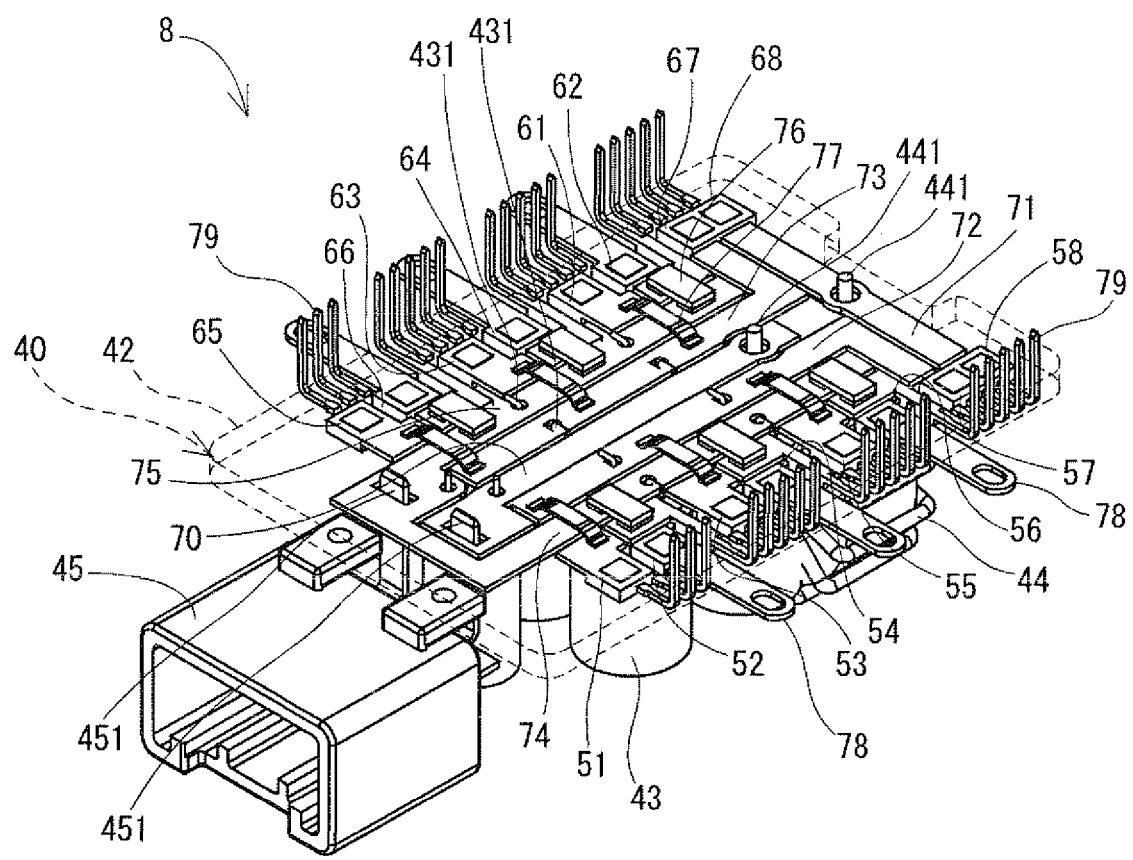
FIG. 13 is a perspective view showing the drive unit except a resin mold according to the first embodiment.

As shown in FIG. 12, the radiator plates 59 of the power transistors 51-58, 61-68 are exposed on an outer wall of the mold resin 42 in a board thickness direction of the mold resin 42.

Terminals 78 and signal wirings 79 connected with the power transistors 51-58, 61-68 protrude from the outer edge portions on the long sides of the power module 40 to an outside of the mold resin. The terminals 78 are electrically connected with the extraction lines 19 of the coil 18. The signal wirings 79 are electrically connected with a control circuit of the control board 30.

The aluminum electrolytic capacitors 43 and the choke coil 44 as electronic components are provided on one side of the power module 40 with respect to the board thickness direction of the power module 40. The aluminum electrolytic capacitors 43 and the choke coil 44 are provided inside the outer edge portions of the power module 40.

The aluminum electrolytic capacitors 43 absorb ripple currents generated by switching of the power transistors 51-58, 61-68. The choke coil 44 attenuates fluctuation of a current supplied to the power transistors 51-58, 61-68.

A first connector 45 is provided to an end portion of the power module 40 on one short side of the power module 40. A current is supplied from a battery 5 to the power module 40 through the first connector 45.

The aluminum electrolytic capacitors 43, the choke coil 44 and the first connector 45 are electrically connected with the wirings 70-75 of the power module 40. More specifically, lead wires 431 extending from main bodies of the aluminum electrolytic capacitors 43 pass through the power module 40 in the board thickness direction of the power module 40. The lead wires 431 are electrically connected with the wirings 72-75 of the power module 40 by a welding process or a soldering process inside holes 46 formed on a side of the power module 40 opposite to the main bodies of the aluminum electrolytic capacitors 43.

Likewise, lead wires 441 extending from a main body of the choke coil 44 pass through the power module 40 in the board thickness direction of the power module 40. The lead wires 441 are electrically connected with the wirings 70, 71 of the power module 40 by the welding process or the soldering process inside the holes 46 formed on the side of the power module 40 opposite to the main body of the choke coil 44.

Further, lead wires 451 extending from a main body of the first connector 45 pass through the power module 40 in the board thickness direction of the power module 40. The lead wires 451 are electrically connected with the wirings 70, 74, 75 of the power module 40 by the welding process or the soldering process inside the hole 46 formed on the side of the power module 40 opposite to the main body of the first connector 45.

A flow of the current in the power module 40 will be explained. The current supplied from the battery 5 to the first connector 45 flows from the wiring 70 in the center of the power module 40 to the wiring 71 on the short side opposite to the first connector 45 via the choke coil 44. Then, the current flows from the wiring 71 to the wirings 72, 73 provided on both left and right sides of the central wiring 70 via the circuit protection power transistors 57, 58, 67, 68 provided in the outer edge portions on both sides. Then, the current flows from the wirings 72, 73 to the coil 18 via the jumper wirings 77, the power transistors 51, 53, 55, 61, 63, 65 on a power supply side and the extraction lines 19 connected to the terminals 78. The current returning from the coil 18 flows from the terminals 78 to the wirings 74, 75 inside the power transistors 51-56, 61-66 via the power transistors 52, 54, 56, 62, 64, 66 on a ground side and the shunt resistances 76. Then, the current flows from the wirings 74, 75 to the battery 5 via the first connector 45.

The inverter circuits formed in the power module 40 are shown in FIG. 6. FIG. 6 shows one set of the inverter circuit formed by the six power transistors 51-56 and the like. A circuit diagram of the other set of the inverter circuit is omitted in FIG. 6. The two sets of the inverter circuits generate a three-phase alternating current as a drive current supplied to the coil 18, which forms two systems of the three-phase winding.

Figure 14:
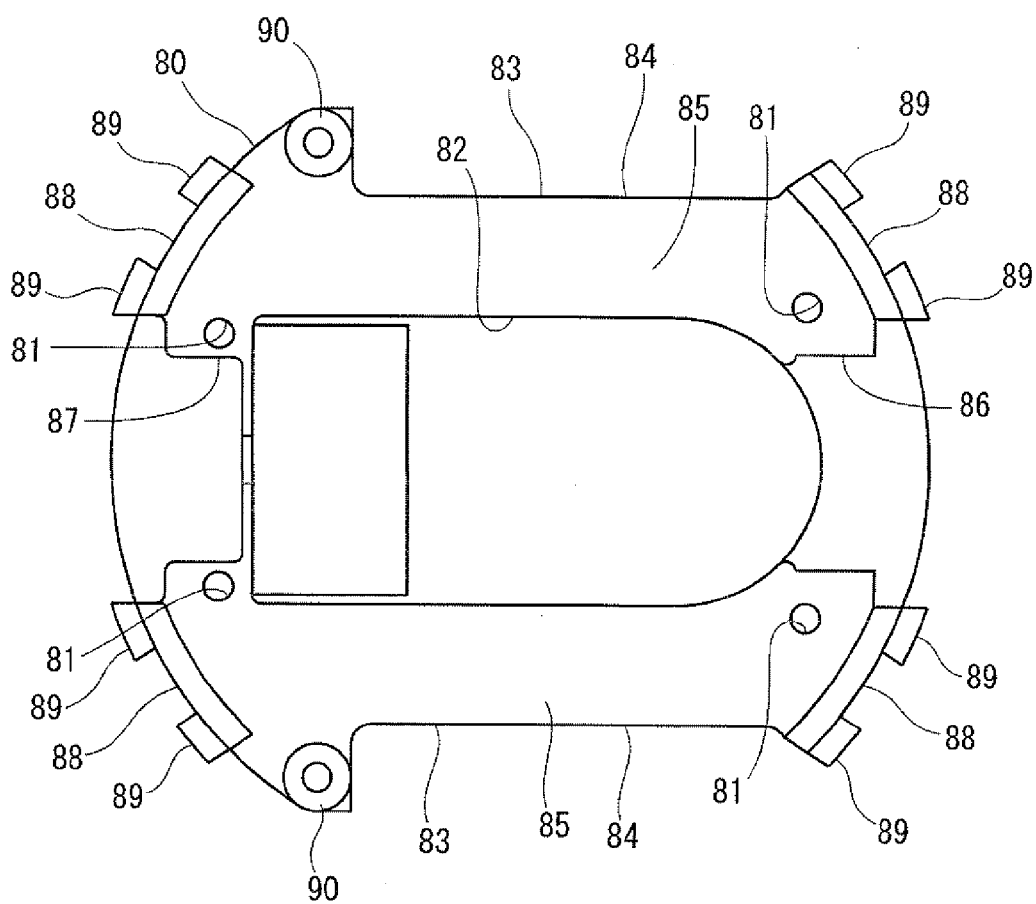
FIG. 14 is a bottom view showing a heat sink of the motorized equipment according to the first embodiment.
Figure 15:
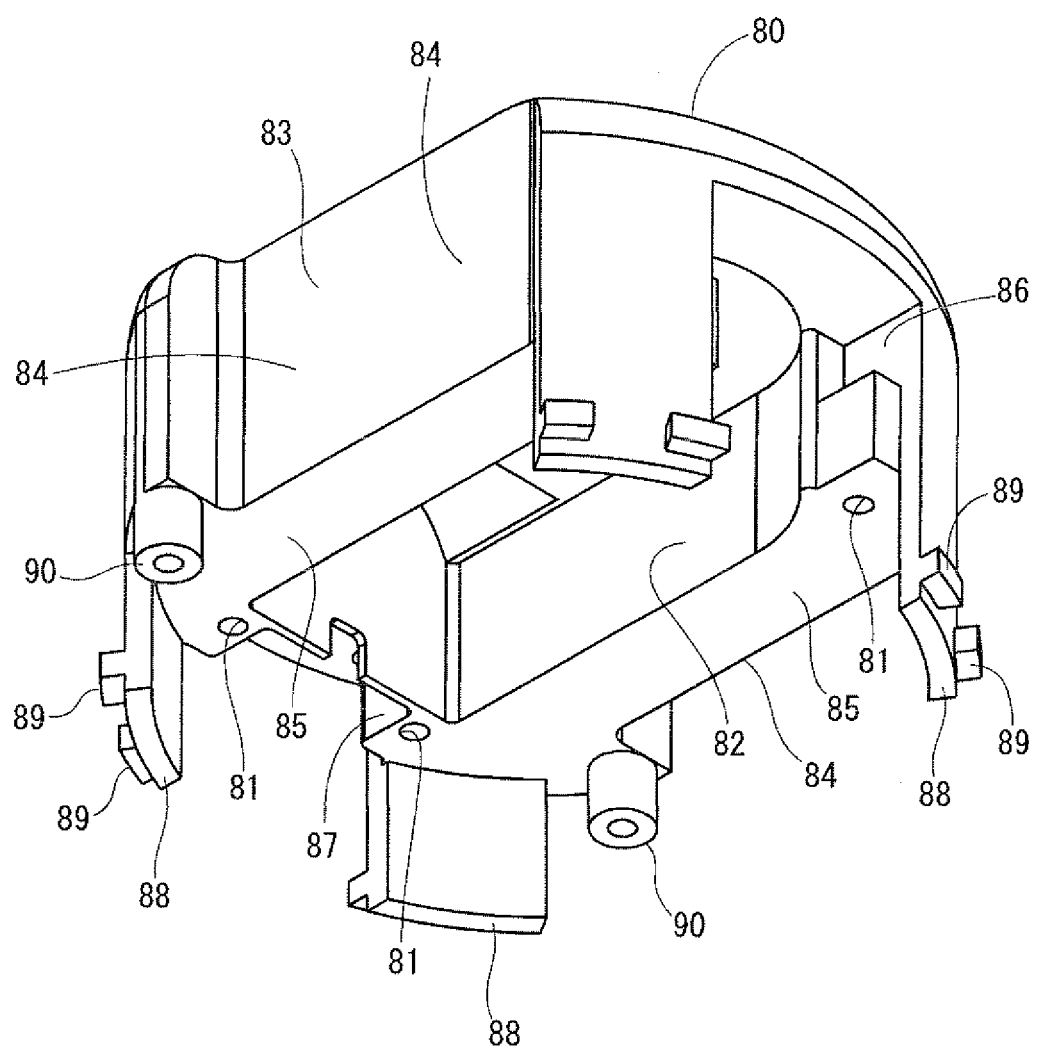
FIG. 15 is a perspective view showing the heat sink according to the first embodiment.
Figure 16:
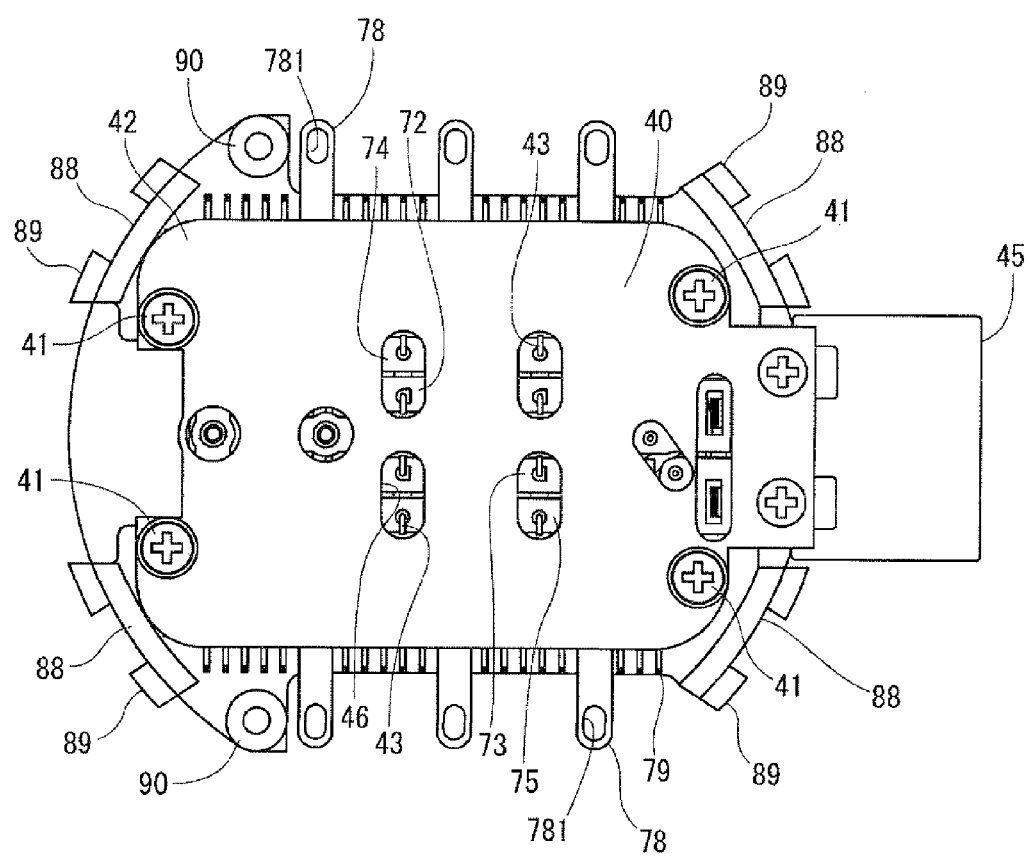
FIG. 16 is a bottom view showing the drive unit attached to the heat sink according to the first embodiment.
Figure 17:
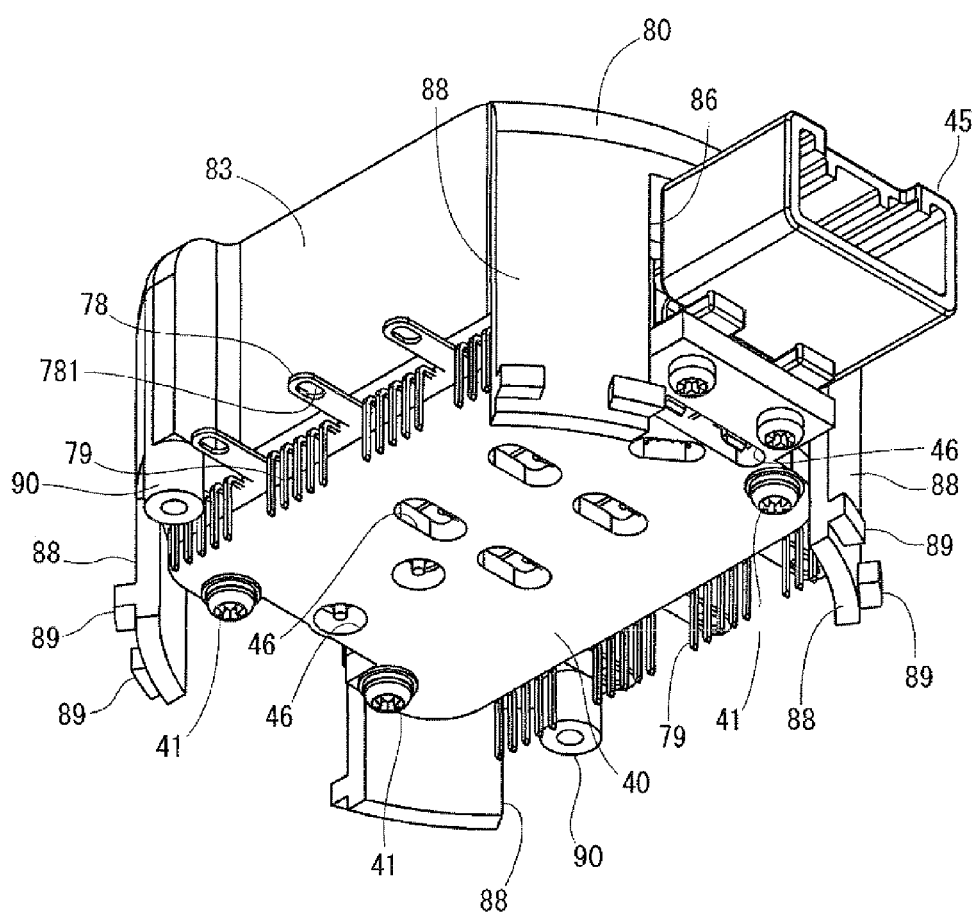
FIG. 17 is a perspective view showing the drive unit attached to the heat sink according to the first embodiment.

As shown in FIGS. 14 and 15, the heat sink 80 is made of a material such as aluminum having high heat conductivity. The heat sink 80 is formed to have a volume having a heat capacity capable of absorbing the heat generated by the power module 40 according to the output of the electric motor 7.

The heat sink 80 has a recess 82 in its central portion. The recess 82 is formed to have a size capable of accommodating the aluminum electrolytic capacitors 43 and the choke coil 44. The heat sink 80 has flat surface sections 83 at positions substantially and axially overlapping with the long sides of the power module 40, which is radially outside the heat sink 80. Thus, the terminals 78 protruding outward from the long sides of the power module 40 can be connected with the extraction lines 19 of the coil 18.

The heat sink 80 has two columnar sections 84, each of which is interposed between the recess 82 and the flat surface section 83. Heat receiving surfaces 85 are formed on the columnar sections 84 on a power module 40 side. The heat receiving surface 85 of one of the columnar sections 84 contacts the radiator plates 59 of the power transistors 51-58, which are arranged in line in the outer edge portion of the power module 40 on one long side, across the insulation radiation sheet 69. The heat receiving surface 85 of the other one of the columnar sections 84 contacts the radiator plates 59 of the power transistors 61-68, which are arranged in line in the outer edge portion of the power module 40 on the other long side, across the insulation radiation sheet 69. The radiator plates 59 of the power transistors 51-58, 61-68 are arranged on the same plane. Thus, the heat generated by the power module 40 transfers to the heat sink 80.

The heat sink 80 has openings 86, 87 at positions corresponding to the first connector 45 of the power module 40 and a second connector 39 of the control board 30 (explained in detail later). The heat sink 80 has four support members 88 between the openings 86, 87 and the flat surface sections 83. The support members 88 extend toward an electric motor 7 side in the axial direction.

The control board 30 is provided on a second motor case 13 side of the power module 40 substantially parallel to the power module 40 as shown in FIGS. 1 to 4, 18 and 19. The control board 30 is made of a material such as a glass epoxy substrate and is electrically connected with the signal wirings 79 protruding from the power module 40. The control board 30 has the second connector 39 on a side opposite to the first connector 45 of the power module 40. The control board 30 has holes 311, through which the extraction lines 19 are passed, at positions overlapping with holes 781 of the terminals 78 of the power module 40 in the axial direction.

The control circuit mounted with a microcomputer 32, pre-drivers 33, a custom IC 34, a position sensor 35 and the like is formed in the control board 30. A surface, on which the control circuit is mounted, is shown by a broken line 9 in FIGS. 18 and 19. However, the control circuit is not necessarily formed inside an area encircled by the broken line 9. The broken line 9 conceptually indicates an area where the mounting is easy. The control circuit is mounted inside the signal wirings 79 electrically connected with the power transistors 51-58, 61-68.

The position sensor 35 is mounted on the second motor case 13 side of the control board 30. The position sensor 35 outputs a signal corresponding to a direction of a magnetic field generated by a magnet 29 arranged on the one end portion of the shaft 25.

A construction of the control circuit is shown in FIG. 6. As shown in FIG. 6, the custom IC 34 has a position sensor signal amplifier 36, a regulator 37 and a sensed current amplifier 38 as functional blocks. The signal outputted by the position sensor 35 is amplified by the position sensor signal amplifier 36 and is inputted to the microcomputer 32. Thus, the microcomputer 32 senses a position of the rotor 21 fixed to the shaft 25.

The torque signal outputted from the torque sensor 4 and the like are inputted to the microcomputer 32 via the second connector 39. The currents of the inverter circuit sensed by the shunt resistances 76 are inputted to the microcomputer 32 via the sensed current amplifier 38.

The microcomputer 32 assists steering of the steering 3 according to vehicle speed based on the signals from the position sensor 35, the torque sensor 4, the shunt resistances 76 and the like. In order to do so, the microcomputer 32 outputs pulse signals, which are produced by PWM control, to the power transistors 51-56, 61-66 via the pre-drivers 33. Thus, the two sets of the inverter circuits formed by the power transistors convert the current, which is supplied from the battery 5 via the choke coil 44 and the circuit protection power transistors 57, 58, 67, 68, into the three-phase alternating current and supply the three-phase alternating current to the coil 18 from the extraction lines 19 connected to the terminals 78.

Next, an assembling method of the motorized equipment 10 according to the present embodiment will be explained. First, as mentioned above, the aluminum electrolytic capacitors 43, the choke coil 44, the first connector 45 and the like are attached to the wirings 70-75 of the power module 40, in which the power transistors 51-58, 61-68, the wirings 70-75 and the like are inserted by the resin molding. Thus, the drive unit 8 is formed.

Then, as shown in FIGS. 7 and 14 to 17, the power module 40 is attached to the heat sink 80. The power module 40 is attached to the heat sink 80 by fixing the power module 40 to screw holes 81 formed in a bottom of the heat sink 80 by the screws 41. At that time, the insulation radiation sheets 69 are inserted between the radiator plates 59 of the power transistors 51-58, 61-68 and the heat receiving surfaces 85 of the heat sink 80. If the power module 40 is attached to the heat sink 80, the aluminum electrolytic capacitors 43 and the choke coil 44 are inserted into the recess 82 of the heat sink 80. The first connector 45 protrudes from the opening 86 of the heat sink 80 to the outside of the heat sink 80.

Figure 18:
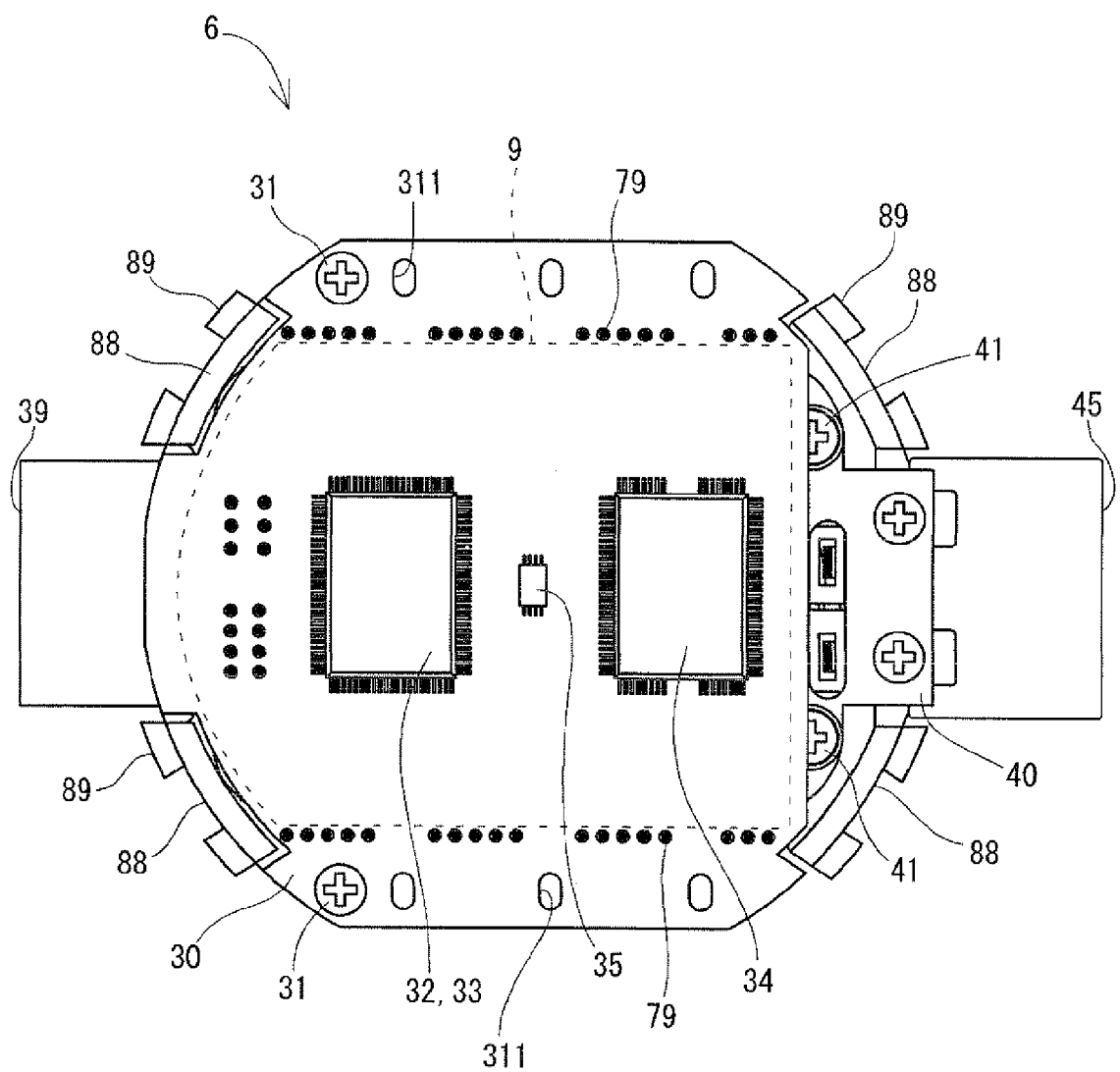
FIG. 18 is a bottom view showing the drive unit and a control board attached to the heat sink according to the first embodiment.
Figure 19:
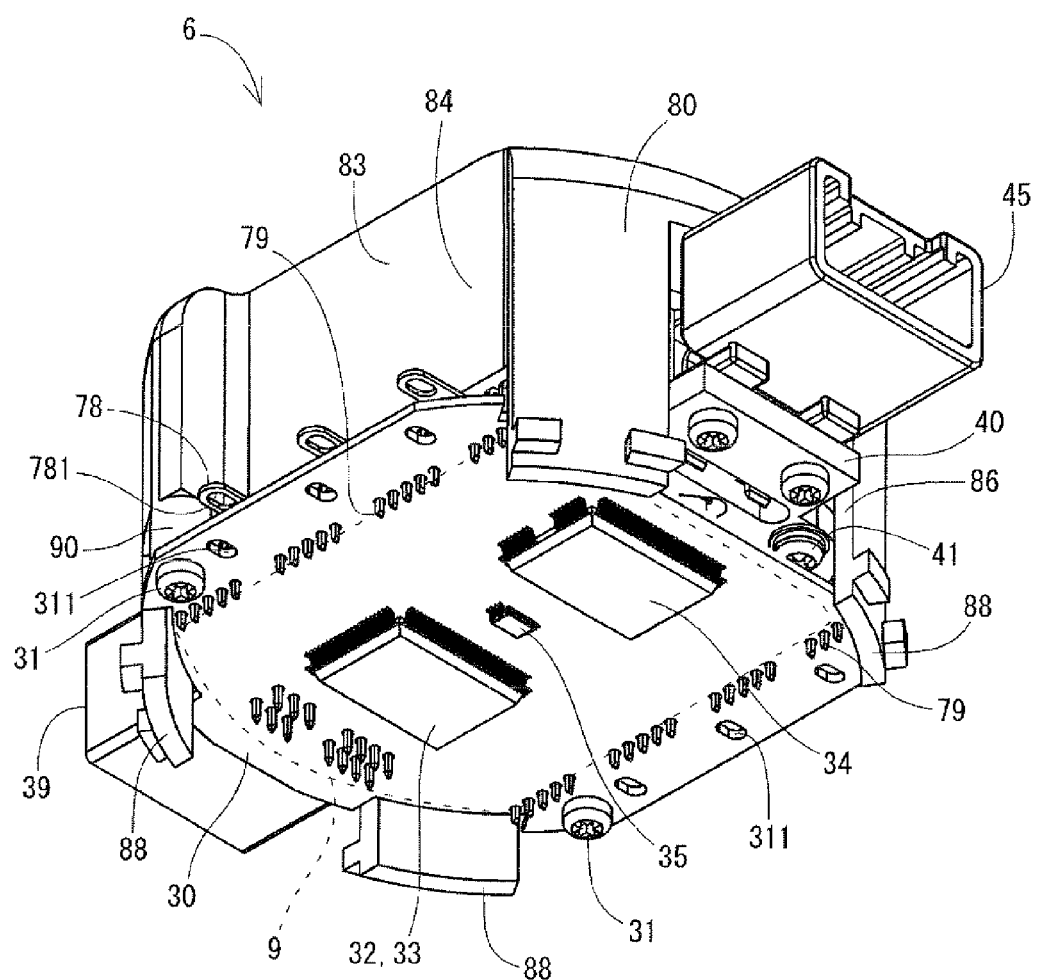
FIG. 19 is a perspective view showing the drive unit and the control board attached to the heat sink according to the first embodiment.

Then, as shown in FIGS. 18 and 19, the control board 30 is attached to the heat sink 80. The control board 30 is attached to the heat sink 80 by fixing the control board 30 to columns 90 extending from the heat sink 80 in the axial direction with the screws 31. Then, the signal wirings 79 of the power module 40 are electrically connected to the wirings of the control board 30 by the soldering process or the welding process. At that time, the second connector 39 protrudes from the opening 87 of the heat sink 80 to the outside of the heat sink 80.

Then, as shown in FIGS. 2 to 5, the heat sink 80 is attached to the electric motor 7. The heat sink 80 is attached to the electric motor 7 by bringing axial end portions of the support members 88 of the heat sink 80 on the electric motor 7 side and an axial end portion of the first motor case 12 on the controller 6 side into contact with each other. Claws 121 extending from the first motor case 12 in the axial direction are inserted between protrusions 89 formed on the end portions of the support members 88. The claws 121 are bent to the circumferential direction to fix the heat sink 80 and the first motor case 12. Each pair of claws 121 extending parallel to each other are bent to opposite sides of the circumferential direction respectively. At that time, the extraction lines 19 extending through the holes 20 of the second motor case 13 in the axial direction are inserted through the holes 311 of the control board 30 and the holes 781 of the terminals 78 of the power module 40. Then, the extraction lines 19 and the terminals 78 of the power module 40 are electrically connected with each other by the welding process or the soldering process.

Finally, as shown in FIGS. 1 and 7, the heat sink 80 is covered with the cover 91 formed substantially in the shape of a cylinder with bottom. The cover 91 and the heat sink 80 are fixed by screws 92. The cover 91 is made of a magnetic body such as iron and inhibits a magnetic field, which is generated by a large current passing through the power transistors 51-58, 61-68, from leaking to the outside. The cover 91 also prevents dusts and the like from entering the controller 6. Thus, the motorized equipment 10 is completed.

In the present embodiment, the multiple power transistors 51-58, 61-68 and the wirings 70-75 connecting the power transistors 51-58, 61-68 are arranged on the same plane and covered with the resin by the resin molding, thereby forming the power module 40. The aluminum electrolytic capacitors 43, the choke coil 44 and the first connector 45 are arranged in the board thickness direction of the power module 40 and are electrically connected with the wirings 70-75 of the power module 40.

In this way, the wirings 70-75 inserted in the power module 40 by the resin molding and the large-size electronic components are connected directly with each other. Accordingly, a conventional metallic substrate mounted with power transistors, a conventional large current wiring busbar mounted with large-size electronic components, terminals connecting the metallic substrate and the large current wiring busbar and the like can be abolished. Therefore, a manufacturing cost of the drive unit 8 and the motorized equipment 10 can be reduced.

Moreover, by arranging the multiple power transistors 51-58, 61-68 and the wirings 70-75 on the same plane, the board thickness of the power module 40 can be reduced.

In the present embodiment, the lead wires 431, 441 extending from the main bodies of the aluminum electrolytic capacitors 43 and the choke coil 44 pass through the power module 40 in the board thickness direction and are electrically connected with the wirings 70-75 of the power module 40 inside the holes formed in the power module 40. Thus, the connections between the lead wires 431, 441 of the aluminum electrolytic capacitors 43 and the choke coil 44 and the wirings 70-75 of the power module 40 do not protrude outward from the outer wall of the power module 40 in the thickness direction of the power module 40. Thus, the body size of the drive unit 8 can be reduced by reducing the spaces for the connection.

In the present embodiment, the power transistors 51-58, 61-68 are arranged in the outer edge portions of the power module 40. Thus, the terminals 78 for electrically connecting the power transistors 51-58, 61-68 and the extraction lines 19 of the coil 18 can be shortened, and electric resistances of the terminals 78 can be reduced. Therefore, a loss in the drive current, which is supplied from the power transistors 51-58, 61-68 to the coil 18 via the terminals 78 and the extraction lines 19, can be reduced.

In the present embodiment, the power module 40 has the power supply side wirings 70, 72, 73 and the ground side windings 74, 75. The power supply side windings 70, 72, 73 extend in the central portion of the power module 40 along the arrangement direction of the power transistors 51-58, 61-68. The ground side windings 74, 75 extend on both sides of the power supply side windings 70, 72, 73 along the arrangement direction of the power transistors 51-58, 61-68 and electrically connect with the power transistors 51-58, 61-68. Thus, length of the wirings 70-75 can be shortened and electric resistances thereof can be reduced. Accordingly, a loss in the current flowing through the power module 40 can be reduced.

Since the power supply side wirings 70, 72, 73 and the ground side wirings 74, 75 are arranged parallel to each other, the lead wires 431, 441, 451 of the aluminum electrolytic capacitors 43, the choke coil 44 and the first connector 45, which are arranged in the board thickness direction of the power module 40, and the wirings 72-75 of the power module 40 can be electrically connected with ease.

In the present embodiment, the signal wirings 79 of the power module 40 are electrically connected with the control circuit at the outer edge portion of the control board 30. Therefore, the surface inside the outer edge portion of the control board 30 can be used effectively to arrange the components constituting the control circuit such as the microcomputer 32, the custom IC 34 and the position sensor 35. Therefore, a degree of freedom of design of the control circuit is heightened, so the mounting area of the control circuit can be reduced. Accordingly, the control board 30 can be reduced in size and a body size of the motorized equipment 10 can be reduced.

In the present embodiment, the aluminum electrolytic capacitors 43, the choke coil 44 and the first connector 45, which are arranged on the side of the power module 40 with respect to the board thickness direction of the power module 40, are accommodated in the recess 82 of the heat sink 80. Accordingly, the body size of the motorized equipment 10 can be reduced.

Other Embodiments

In the above-described embodiment, the brushless motor used for the electric power steering is used as the example. Alternatively, the motorized equipment according to the present invention may be used for various uses other than the electric power steering. The present invention may be applied to a motor with brush, in which a coil is wound around a rotor.

In the above-described embodiment, the two sets of the inverter circuits are formed by the twelve power transistors in the motorized equipment, which drives and controls the electric motor by the drive control of the two systems. Alternatively, the motorized equipment according to the present invention may drive and control the electric motor by drive control of a single system or three or more systems.

In the above-described embodiment, the single power module is formed by inserting the twelve power transistors and the wirings connecting the power transistors in the resin by the resin molding. Alternatively, the present invention may be applied to a construction having multiple power modules, each of which is formed by inserting multiple power transistors and wirings connecting the power transistors in a resin by resin molding. The power module may be formed by inserting the power transistors and parts of the wirings in the resin by the resin molding.

In the above-described embodiment, the aluminum electrolytic capacitors and the choke coil are arranged in the longitudinal direction in the board thickness direction of the power module. Alternatively, the aluminum electrolytic capacitors and the choke coil may be arranged laterally in the board thickness direction of the power module.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A drive unit of an electric motor, which has a rotor rotatable relative to a stator, for rotating and driving the rotor relative to the stator, the drive unit comprising:
a power module formed by inserting a plurality of power transistors, which supply a drive current to a coil wound around the stator or the rotor, and wirings connecting the power transistors in a resin, which is formed in the shape of a plate, by resin molding; and
an electronic component provided in a board thickness direction of the power module and electrically connected with the wirings of the power module, wherein:
the power transistors and the wirings connecting the power transistors are arranged on a same plane;
the electronic component has lead wires extending from a main body thereof; and
the lead wires pass through the power module in the board thickness direction of the power module and are electrically connected with the wirings of the power module inside holes formed on a side of the power module opposite to the main body of the electronic component.

2. The drive unit as in claim 1, wherein
the power module has a terminal, one end of which is connected with the power transistor and the other end of which protrudes from the resin of the power module to an outside and is electrically connectable with an extraction line of the coil,
the power module is formed substantially in the rectangular shape, and
the power transistors are arranged in outer edge portions on both sides of the power module.

3. The drive unit as in claim 2, wherein
the wirings of the power module include a first wiring on one of a power supply side and a ground side, the first wiring extending in a central portion of the power module along an arrangement direction of the power transistors, and a second wiring on the other one of the power supply side and the ground side, the second wiring extending on both sides of the first wiring along the arrangement direction of the power transistors and being electrically connected with the power transistors, and
the power module has jumper wirings for electrically connecting the first wiring and the power transistors.

4. The drive unit as in claim 1, wherein
the electronic component is a capacitor for absorbing a ripple current generated by switching of the power transistor.

5. The drive unit as in claim 1, wherein
the electronic component is a choke coil for attenuating a high-frequency current flowing through the power transistor.

6. The drive unit as in claim 1, further comprising:
a connector provided in the board thickness direction of the power module and electrically connected with the wirings of the power module.

7. A motorized equipment comprising:
a stator;
a rotor provided to be rotatable relative to the stator;
a power module formed by inserting a plurality of power transistors, which supply a drive current to a coil wound around the stator or the rotor, and wirings connecting the power transistors in a resin, which is formed in the shape of a plate, by resin molding;
an electronic component provided in a board thickness direction of the power module and electrically connected with the wirings of the power module;
a control board provided in the board thickness direction of the power module and substantially parallel to the power module, the control board having a control circuit for controlling relative rotation drive between the stator and the rotor; and
a heat sink provided on a side of the power module opposite to the control board for absorbing a heat generated by the power transistors, wherein:
the power transistors and the wirings connecting the power transistors are arranged on a same plane;
the electronic component is arranged inside the power transistor, which are arranged in outer edge portions on both sides of the power module formed substantially in the rectangular shape, and
the heat sink has a plurality of columnar sections, which are thermally connected with radiation sections of the power transistors exposed from an outer wall of the power module in the board thickness direction of the power module, and a recess formed between the columnar sections for accommodating the electronic component.

8. The motorized equipment as in claim 7, wherein:

the power module has a signal wiring, one end of which is connected with the power transistor and the other end of which protrudes from an outer edge portion of the power module to an outside and is electrically connected with the control circuit of the control board.

9. A motorized equipment comprising:

a stator;

a rotor provided to be rotatable relative to the stator;

a power module formed by inserting a plurality of power transistors, which supply a drive current to a coil wound around the stator or the rotor, and wirings connecting the power transistors in a resin, which is formed in the shape of a plate, by resin molding;

an electronic component provided in a board thickness direction of the power module and electrically connected with the wirings of the power module, wherein:

the power transistors and the wirings connecting the power transistors are arranged on a same plane;

the electronic component has lead wires extending from a main body thereof; and the lead wires pass through the power module in the board thickness direction of the power module and are electrically connected with the wirings of the power module inside holes formed on a side of the power module opposite to the main body of the electronic component.

\* \* \* \* \*